United States Patent
Lyford et al.

(10) Patent No.: US 12,231,084 B2
(45) Date of Patent: Feb. 18, 2025

(54) DEVICE FOR GENERATING ELECTRICITY

(71) Applicant: CLEARVUE TECHNOLOGIES LTD, West Perth (AU)

(72) Inventors: Jamie Lyford, West Perth (AU); Victor Rosenberg, West Perth (AU); Kim Harmer, West Perth (AU)

(73) Assignee: CLEARVUE TECHNOLOGIES LTD, Western Perth (AU)

( * ) Notice: Subject to any disclaimer, the term of this patent is extended or adjusted under 35 U.S.C. 154(b) by 688 days.

(21) Appl. No.: 17/261,468

(22) PCT Filed: Jun. 27, 2019

(86) PCT No.: PCT/AU2019/050678
§ 371 (c)(1),
(2) Date: Jan. 19, 2021

(87) PCT Pub. No.: WO2020/014733
PCT Pub. Date: Jan. 23, 2020

(65) Prior Publication Data
US 2021/0257967 A1    Aug. 19, 2021

(30) Foreign Application Priority Data
Jul. 20, 2018   (AU) ................. 2018902635

(51) Int. Cl.
*H02S 40/36* (2014.01)
*E06B 7/28* (2006.01)
(Continued)

(52) U.S. Cl.
CPC .............. *H02S 40/36* (2014.12); *E06B 7/28* (2013.01); *H01R 13/6215* (2013.01);
(Continued)

(58) Field of Classification Search
CPC . H02S 40/36; H02S 20/22; E06B 7/28; H01R 13/6215; H01R 13/627; H01R 31/06; H01R 35/04; H01R 35/00
See application file for complete search history.

(56) References Cited

U.S. PATENT DOCUMENTS

| 4,657,320 A | 4/1987 | Bamford et al. |
| 7,553,166 B2 | 6/2009 | Gobron |

(Continued)

FOREIGN PATENT DOCUMENTS

| DE | 19641090 A1 * | 4/1997 | ........... H01R 25/145 |
| WO | 2013003890 A1 | 1/2013 | |

(Continued)

OTHER PUBLICATIONS

DE-19641090-A1, Machine Translation, Risto (Year: 1997).*
(Continued)

*Primary Examiner* — Devina Pillay
(74) *Attorney, Agent, or Firm* — Michael Best & Friedrich LLP

(57) ABSTRACT

The present disclosure provides a system for generating electricity. The system comprises at least two photovoltaic modules each having at least one photovoltaic element. Each photovoltaic module has ends and each end has an electrical coupling portion that is electrically coupled to the at least one photovoltaic cell. Each photovoltaic module is configured to be positioned in use near a perimeter of a panel that is at least partially transmissive for visible light. The system further comprises an electrical connector configured to electrically couple to the electrical coupling portions of adjacent photovoltaic modules.

16 Claims, 3 Drawing Sheets

(51) Int. Cl.
    *H01R 13/621*     (2006.01)
    *H01R 13/627*     (2006.01)
    *H01R 31/06*     (2006.01)
    *H01R 35/04*     (2006.01)
    *H02S 20/22*     (2014.01)

(52) U.S. Cl.
    CPC ........... *H01R 13/627* (2013.01); *H01R 31/06* (2013.01); *H01R 35/04* (2013.01); *H02S 20/22* (2014.12)

(56) References Cited

U.S. PATENT DOCUMENTS

| | | |
|---|---|---|
| 2010/0180887 A1 | 7/2010 | Dziadik |
| 2011/0011642 A1 | 1/2011 | Solon |
| 2020/0321908 A1* | 10/2020 | Anders ................... H02J 3/381 |

FOREIGN PATENT DOCUMENTS

| | | |
|---|---|---|
| WO | 2013003894 A1 | 1/2013 |
| WO | 2015/024046 A1 | 2/2015 |

OTHER PUBLICATIONS

European Patent Office Extended Search Report for Application No. 19838046.1 dated Apr. 4, 2022 (6 pages).
International Search Report and Written Opinion mailed in International Patent Application No. PCT/AU2019/050678 mailed on Aug. 15, 2019 (9 pages).

\* cited by examiner

DEVICE FOR GENERATING ELECTRICITY

TECHNICAL FIELD

The present disclosure relates to a device for generating electricity and relates particularly, though not exclusively, to a device comprising a photovoltaic element.

BACKGROUND

Overheating of interior spaces, such as spaces that receive sunlight through large windows, is a problem that may be overcome using air conditioners. A large amount of energy is globally used to cool interior spaces. The majority of electrical energy is generated using non-sustainable sources, which is of increasing environmental concern.

PCT international applications numbers PCT/AU2012/000778, PCT/AU2012/000787 and PCT/AU2014/000814 (owned by the present applicant) disclose a spectrally selective panel that may be used as a windowpane and that is largely transmissive for visible light, but diverts a portion of incident light to side portions of the panel where it is absorbed by photovoltaic elements to generate electricity. The disclosed panels are integrated with a window frame, which carries both the panels and the photovoltaic elements solar cells.

It is to be understood that, if any prior art publication is referred to herein, such reference does not constitute an admission that the publication forms a part of the common general knowledge in the art, in Australia or any other country.

SUMMARY

The present disclosure provides a system for generating electricity, the system comprising:
- at least two adjacent photovoltaic modules each having at least one photovoltaic cell, each photovoltaic module having ends, each end having an electrical coupling portion that is electrically coupled to the at least one photovoltaic cell, each photovoltaic module being configured to be positioned near a perimeter of a panel that is at least partially transmissive for visible light; and
- a connector configured to electrically couple to the electrical coupling portions of adjacent photovoltaic modules.

The term "arranging a photovoltaic module near a perimeter of a panel" is to be interpreted broadly to include positioning the photovoltaic module on a structure associated near the perimeter of the panel but not necessarily on the panel. Thus, the photovoltaic module need not be connected to the panel.

At least one of the at least two photovoltaic modules may have a photon receiving surface and may be arranged for positioning at an edge region of the panel and such that the photon receiving surface is substantially parallel to a photon receiving surface of the panel. Further, at least one of the at least two photovoltaic modules may have a photon receiving surface and may be arranged for positioning at an edge region of the panel and such that the photon receiving surface is substantially parallel to an edge surface of the panel.

The connector may have a first connecting region and a second connecting region. The first connecting region may be configured to couple to the electrical coupling portion of one of the photovoltaic modules and the second connecting region may be configured to couple to the electrical coupling portion of an adjacent second one of the photovoltaic modules.

In a first embodiment, the connector is structured so that the first and second connecting regions are in a fixed relationship relative to one another. A longitudinal axis of each of the first and second connection regions may be arranged relative to one another at an angle ranging from about 0° to about 180°. For example, the connector may form a corner connector where the first and second connection regions are positioned approximately 90° relative to one another. A corner connector may be used to connect adjacent photovoltaic modules that are positioned near a corner of a panel. A straight connector may be formed when the first and second connection regions are positions 180° relative to one another. The straight connector may be used to connect the photovoltaic modules in a straight line.

In a second embodiment the first and second connecting regions are pivotably connected to one another, for example via a hinge or pivot point. A pivotable connection may help to allow adjacent photovoltaic elements being positioned at a plurality of angles relative to one another, for example between about 0° and about 180°. The first and second connection regions may define a plane and the connector may be arranged such that the first and second connection regions are pivotable within that plane. Alternatively, the first and second connection regions may define a plane when in flat (straight) configuration, and the connector may be arranged such that the plane of the first connection region is transverse to the plane of the second connection region when the first and second connection regions are pivoted relative to each other and out of the flat (straight) configuration.

In some embodiments at least one of the first and second connecting regions has an extendable region that is moveable relative to the respective connecting region.

In some embodiments one or both ends of at least one of the at least two photovoltaic modules have electrical coupling portions that comprise a female coupling portion and the connector comprises one or more respective male connection portions for coupling to the female coupling portion on the electrical coupling portion. Alternatively, or in addition to, in some embodiments one or both ends of at least one of the at least two photovoltaic modules have electrical coupling portions that comprise a male coupling portion and the connector comprises one or more respective female connection portions for coupling to the male coupling portion on the electrical coupling portion. For example, a photovoltaic module may have female or male connection portions at both ends, or a photovoltaic module may have a male connection portion at one end and a female connection portion at the other end.

In an embodiment, a locking means is configured to lock the connector to one or both of the electrical coupling portions from adjacent photovoltaic modules. In an embodiment, the connector may be configured to couple electrical coupling portions from adjacent photovoltaic modules with an interference fit. In an embodiment, the connector may rely on a snap-fit that prevents removal of the connector from the photovoltaic modules once connected to it.

In an embodiment each of the electrical coupling portions comprise a negative terminal and a positive terminal. In this embodiment, the connector is configured to connect respective positive and negative terminals from adjacent photovoltaic modules.

The photovoltaic module may comprise a CIGS or CIGS photovoltaic cell that may be flexible. Alternatively, the photovoltaic module may comprise a Si—, CdS—, CdTe—, GaAs—, CIGS or CIS-based photovoltaic cell. The photovoltaic module may have a length of approximately 500 mm to 1000 mm.

An advantage of the system may be that it allows modular components to be prefabricated and then connected together independent of the size of the panel. For example, if a photovoltaic module has a length of approximately 500 mm and a panel has a width of 1000 mm, two photovoltaic modules can be connected together in a straight line to extend along a region near an edge of the panel. Such an arrangement may help to prevent waste and reduce costs of installing photovoltaic elements on e.g. windows since custom lengths of photovoltaic elements may not be required.

The present disclosure also provides a window panel comprising the system as set forth above.

The disclosure also provides a window panel comprising:
 a panel being at least partially transmissive for visible light; and
 at least two photovoltaic modules and a connector from the system as set forth above;
 wherein the two photovoltaic modules are positioned adjacent to one another near a perimeter of the panel and are connected to one another with the connector.

In an embodiment, the at least two photovoltaic modules are positioned on the panel end-to-end in a straight line approximately parallel to an edge of the panel. Alternatively, or in addition to, in some embodiments the two photovoltaic modules are positioned on the panel so that a longitudinal direction of each module is transverse to one another. In this embodiment, the ends of adjacent photovoltaic modules that are connected by the connector may be positioned near a corner of the panel.

The window may comprise a plurality of photovoltaic modules and a plurality of connectors positioned near the perimeter of the panel.

In an embodiment, the window is in the form of an integrated glass unit.

The present disclosure also provides a method of forming a window panel, comprising:
 arranging two or more photovoltaic modules near a perimeter of a panel that is at least partially transmissive for visible light, each module having two ends where each end has an electrical coupling portion; and
 coupling the electrical coupling portions from adjacent photovoltaic modules with a connector.

Providing the two or more photovoltaic modules and the connector may be performed by providing the system as set forth above.

The present disclosure also provides an electrical connector that in use electrically connects ends of adjacent photovoltaic modules, each photovoltaic module comprising at least one photovoltaic element that are electrically connected to the ends of the module, wherein in use the photovoltaic modules are positioned near a perimeter of a panel that is at least partially transmissive for visible light, the electrical connector comprising:
 a body having a first connecting region and a second connecting region extending from the first connecting region, each of the regions having respective connection portions for electrically connecting ends of adjacent photovoltaic modules, and
 a locking means provided on at least one of the first and second connecting regions for locking the connecting region to an end of one of the adjacent photovoltaic modules.

The connector may be defined as set forth above.

BRIEF DESCRIPTION OF FIGURES

Embodiments will now be described by way of example only with reference to the accompanying non-limiting figures.

DETAILED DESCRIPTION OF EMBODIMENTS

Figure 1:
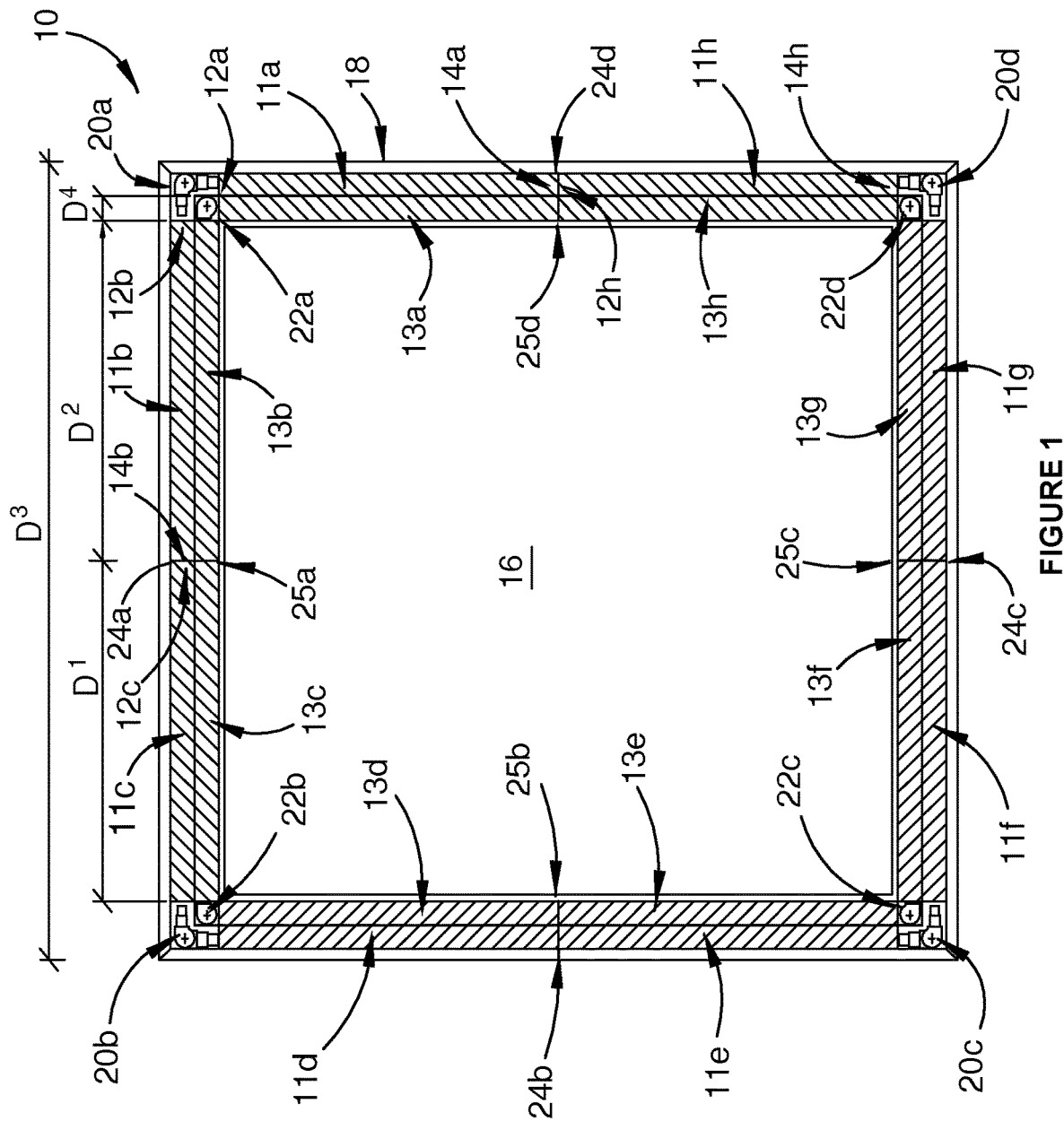
FIG. 1 shows an embodiment of a system according to the disclosure.

An embodiment of a system 10 for generating electricity is shown in FIG. 1. The system 10 may for example be provided in the form of a window pane structure positioned within a (standard) window frame (not shown) of a building. A person skilled in the art will appreciate that the device 10 may be applied to different structures, such as walls and roof and the like.

System 10 has a plurality of photovoltaic elements 11a-11h that are positioned inboard near perimeter 18 of a panel 16. Panel 16 is at least partially transmissive for visible light and in some embodiments in a glass pane. Photovoltaic element 11b has ends 12b and 14b and is positioned transversely to photovoltaic element 11a. End 12b from photovoltaic element 11b is positioned adjacent to end 12a from photovoltaic element 11a. Photovoltaic element 11c is positioned along the same longitudinal axis defined by photovoltaic element 11b so that end 12c is positioned adjacent to end 14b to form junction 24a. In this way element 11c is positioned along the same linear direction of photovoltaic element 11b.

Each end (12a-h and 14a-h) of the elements have an electrical coupling portion (not shown) which can engage with a connector. The connector as will be explained in detail with reference to FIGS. 2-7.

In some embodiments the elements 11a-11h are fixed directly to the panel 16 but in other embodiments the elements 11a-11h are secured to a structure that is associated with the panel 16. This means the elements 11a-h are not directly connected to panel 16 in all embodiments. For example, the elements 11a-h may be positioned on a frame or a support that is spaced from the plane defined by panel 16 so that a gap exists between elements 11a-h and panel.

Unless context indicates otherwise, the numerical references used to describe the ends of the photovoltaic elements are for reference only and do not limit the elements to any sort of specific relative arrangement where one end of one element must be positioned near another end of an adjacent element.

In the embodiment of FIG. 1, a length $D^1$ of element 11c is the same as a length $D^2$ of element 11b, and two elements are each positioned near perimeter of panel 16. However, in some embodiments $D^1$ and $D^2$ are not equal. In an embodiment, both $D^1$ and $D^2$ are 500 mm. In an embodiment a width $D^3$ of the panel 16 is 1181 mm. In FIG. 1, each side of panel 16 has two photovoltaic elements positioned end-to-end at junction 24a-d to form a length of element on each side. In this way, each element 11 in system 10 acts as a pre-fabricated modular unit in which additional modules can be added to provide a required length of element.

Photovoltaic elements 11a-h form a first ring of elements near perimeter 18. A second ring of elements is formed by photovoltaic elements 13a-h positioned inboard from elements 11a-h. In the embodiment of FIG. 1 each of the elements 13a-h have the same length of elements 11a-h. In some embodiments, the lengths of each element 13a-h differ from one another and/or differ from the length of elements 11a-h.

The position of the elements 11a-h and 13a-h are not limited to the arrangement in FIG. 1 and other arrangements can be used. For example, only one ring of elements, i.e. 11a-h or 13a-h, can be used. The panel 16 in FIG. 1 is generally square in shape but the system 10 can be extended to other polygon shapes such as a rectangle, rhombus, triangle, octagon, and so on.

The photovoltaic elements 11a-h and 13a-h may be of the same type or at least some of the photovoltaic elements may be of different types. For example, the photovoltaic elements may comprise different types of semiconductor material, such as one or more of Si, CdS, CdTe, GaAs, CIS or CIGS. In an embodiment, each of the elements include a flexible CIGS photovoltaic cell. It can be advantageous if each of the elements has the same shape and structure as this allows each element to be used as a modular unit. Providing modular units can help to simplify the manufacture of, for example, window elements having photovoltaic elements for generating electricity.

The system 10 also has a connector 20a. Connector 20 electrically couples end 12a from photovoltaic element 11a to end 12b from photovoltaic element 11b. Although not shown in FIG. 1, a connector also electrically connects end 14b from photovoltaic element 11b to end 12c from photovoltaic element 11c at junction 24a. The first ring of elements 11a-h are connected at the corners of the panel 16 with connectors 20-20d, and with connectors at junctions 24a-d. Similarly, the second ring of elements 13a-h are connected at the corners with connectors 22a-d, and with connectors at junctions 25a-d.

In some embodiments the system 10 is installed on a window panel. The window panel may form an integrated glass unit. The photovoltaic elements 11 and 13 may be fixed to a support structure of the integrated glass unit.

The connector may have a further electrical coupling (not shown) for coupling to an external device or an electrical lead and via which generated electrical energy can be diverted away from the device.

Embodiments of the connector will now be described in more detail with reference to FIGS. 2-7.

Figure 2:
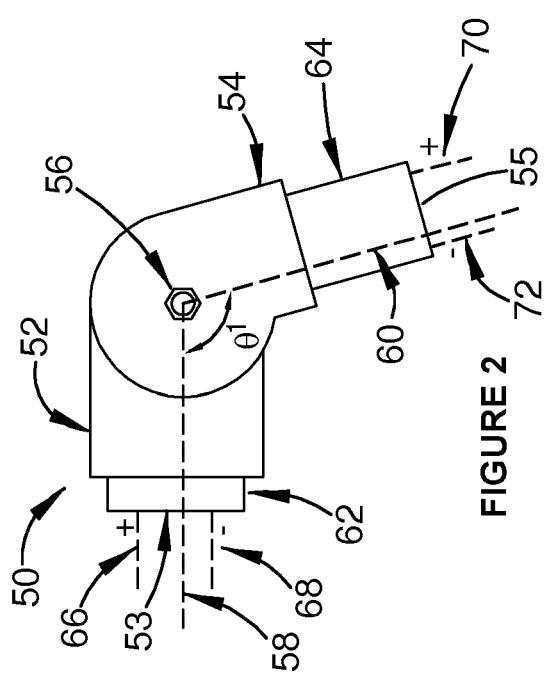
FIG. 2 shows a plan view of an embodiment of a connector.

FIG. 2 shows an embodiment of a connector 50. Connector 50 has body having a first connecting region in the form of first connecting segment 52 and a second connecting region in the form of second segment 54. The first 52 and second 54 segments are pivotably connected to one another around pivot point 56. In an embodiment, pivot point 56 is provided as a bolt that connects the first 52 and second 54 segments together. The pivotable coupling may, or may not, have a locking mechanism that locks together the first 52 and second 54 segments in a selectable angular orientation relative to each other.

Figure 3:
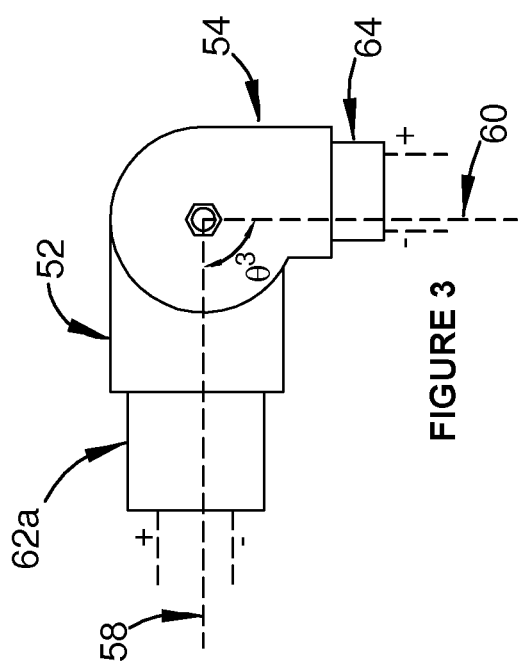
FIG. 3 shows a different orientation of the connector in FIG. 2.
Figure 4:
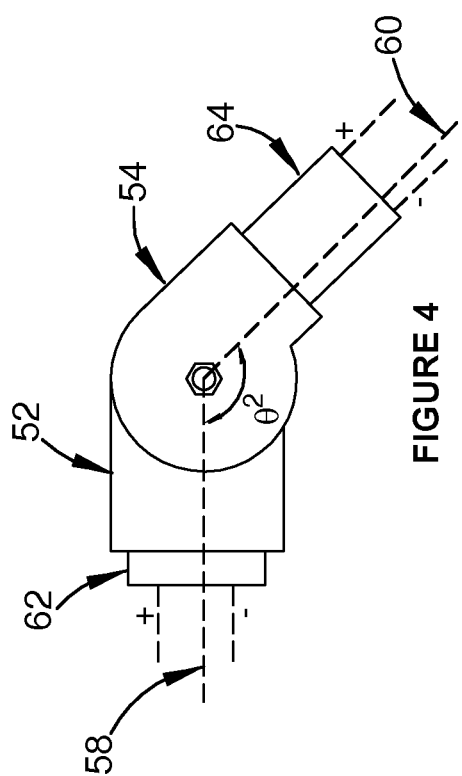
FIG. 4 shows a different orientation of the connector in FIG. 2.

The first 52 and second 54 segments are generally elongate and each have a longitudinal axis 58 and 60, respectively. Because the first 52 and second 54 segments can pivot relative one another, an angle $\theta^1$ is formed between the longitudinal axis 58 of the first segment 52 and the longitudinal axis 60 of the second segment 54. The angle $\theta^1$ can be adjusted by rotating the first 52 and second 54 segments towards or away from each other. As shown in FIG. 3, the second segment 54 is rotated clockwise towards first segment 52 so that angle $\theta^3$ is approximately 90°. In FIG. 4, the second segment 54 is rotated anticlockwise away first segment 52 so that $\theta^2 > \theta^1$. In some embodiments the first 52 and second 54 segments are pivotable relative one another so that an angle formed between the first 52 and second 54 segments varies between 0°-180°. In some embodiments the amount the first 52 and second 54 segments are able to pivot relative to one another is determined by a limit stop. For example, in some embodiments, the first 42 and second 54 segments can only pivot between about 0° to about 90° relative to one another.

Having a connector with a pivotable connection allows the connector 50 to connect ends of adjacent photovoltaic elements e.g. 11a and 11b, regardless of the relative angle between the photovoltaic elements. This can allow for greater flexibility in installing the system on windows of different sizes and shapes. For example, in FIG. 1, connector 50 can be used as connector 20a connecting ends 12a and 12b together when the first 52 and second 54 segments are positioned at about 90° relative to one another, but can also be used to connect ends 12c and 14b together at junction 24a when the first 52 and second 54 segments are positioned at about 180° relative to one another.

In some embodiments, the connector 50 on FIGS. 2-4 are pivotable relatively into and out of page. This may be in addition to the clockwise/anticlockwise rotation of connector 50. Such an articulation can be used to connect adjacent photovoltaic elements that are so that a plane defined by the photovoltaic element is transverse to the plane of the panel 16.

In the embodiments of FIGS. 2 to 4, each of the first 52 and second 54 segments have a first extendable region 62 and a second extendable region 64, respectively. However, in some embodiments only one of the first 62 or second 64 extendable region is provided in connector 50, and in some embodiments the connector does not have extendable regions 62 and 64. An advantage of providing an extendable region is that it provides greater flexibility in the connection region between adjacent photovoltaic elements to easily allow the photovoltaic elements to be correctly positioned relative the panel. Thus, the extendable regions allow the system 10 to be used on a variety of panel sizes and shapes without having to modify the photovoltaic modules and/or connectors.

As an example, when converting the orientation of the connector 50 in FIG. 2 to the orientation shown in FIG. 3, the second segment 54 is rotated clockwise towards the first segment 52, and second extendable region 64 is retracted towards the second segment 54 and the first extendable region 62 is extended away from the first segment 52.

In one embodiment the extendable regions 62 and/or 64 are telescopically arranged with the first 52 and second 54 segments. For example, first 52 and second 54 segments sleeve extendable regions 62 and 64, respectively, and are slidable relative one another. In other embodiments, extendable regions 62 and/or 64 and the first 52 and/or second 54 segments are arranged as plate-like structures that are slidable relative one another along a face of each structure. In some embodiments the extendable regions 62 and/or 64 are biased towards an extended position, for example via a spring.

Being able to adjust the length of the first 52 and second 54 segment via the extendable regions 62 and 64, respectively, means that connector 50 can be used to connect adjacent photovoltaic elements in a variety of positions. For example, in FIG. 1, the extendable regions 62 and 64 are extended by a distance $D^4$ so that the first 52 and second 54 segments of connector 20a can pass around an outer perimeter of connector 22a and connect end 12b to end 12a. The extendable regions help to make the connector modular in that only connector 50 may be required to connect adjacent photovoltaic elements in a variety of positions.

The connector 50 has a positive terminal 66 and negative terminal 68 and near an end 53 of the first segment 52. Connector 50 also has a positive terminal 70 and negative terminal 72 and near an end 55 of the first segment 54. Positive terminal 66 is in electrical communication with positive terminal 70, and negative terminal 68 is in electrical communication with negative terminal 72.

The terminals in FIGS. 2-4 are depicted as dashed lines as the skilled person would readily understand that the terminals could take on many forms to allow electrical coupling to the photovoltaic elements 11a-h and 13a-h. Some embodiments of the terminals are explained below.

In some embodiments the terminals are provided as metal pins that extend away from ends 53 and 55. In this example each coupling region of the connector has a pair of pins, but it will be appreciated by a person skilled in the art that each coupling region may alternatively have another number of pins. In these embodiments, the connector 50 comprises male coupling portions and the electrical coupling portion at ends 12a-h and 14a-h of photovoltaic elements 11a-h and 13a-h would have respective female coupling portions that are engageable with the male coupling portions. In some embodiments the electrical coupling portion at ends 12a-h and 14a-h have male coupling portions and the terminals on the connector 50 have female coupling portions. In some embodiments, one end of the connector 50 has a male coupling portion and the other end has a female coupling portions. In these embodiments, one of the electrical coupling portion at one end of the photovoltaic elements 11a-h and 13a-h would have a respective female coupling portion and the other end of the photovoltaic elements 11a-h and 13a-h would have a respective male coupling portion. Accordingly, the terminals at ends 53 and 55 of connector 50 can be female-female, male-male or male-female.

In other embodiments, the terminals on the connector 50 are each provided as an electrically conductive planar surface that contacts a respective electrically conductive planar surface at an end of the photovoltaic elements 11a-h and 13a-h. In these embodiments, the exterior surface of each planar surface mates with one another to allow for electrical communication between the photovoltaic element and connector.

Figure 5:
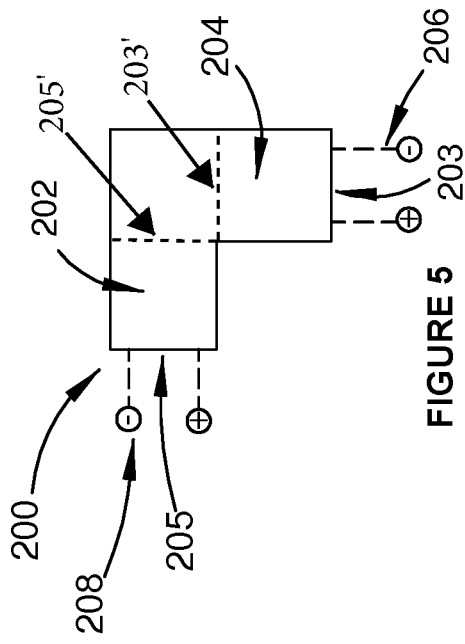
FIG. 5 shows a plan view of another embodiment of a connector.

The connector 50 in FIGS. 2-4 have segments that are rotatable relative one another. However, in some embodiments the segments are fixed relative to one another. FIG. 5 shows an embodiment of a connector 200 where the first segment 202 and second segment 204 are positioned in a fixed relationship substantially perpendicular to one another. Terminals 208 and 206 extend from ends 205 and 206 of the first 202 and second 204 segments, respectively. Because the first 202 and second 204 segments are fixed at right angles to one another, the connector 200 can be used as a corner connector e.g. act as connector 20a as shown in FIG. 1.

Although not shown in FIG. 5, an end region of each of the first 202 and second 204 segment is extendable in some embodiments similar to that of connector 50 but this is not required in all embodiments. In some embodiments a portion of the first 202 and second 204 segments are unitary with one another.

In a variation of the described embodiment the connector 100 may have a substantially rectangular of square shape, as schematically indicated by lines 203' and 205'.

Figure 6:
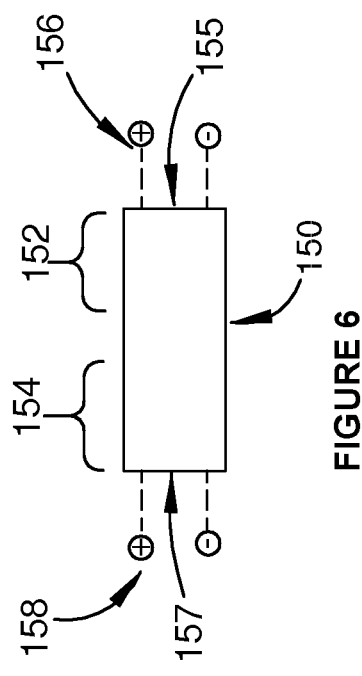
FIG. 6 shows a plan view of another embodiment of a connector.

FIG. 6 shows another embodiment of a connector 150. In this embodiment, the first 152 and second 154 segments share a common longitudinal axis where the terminals 156 and 158 extend away from each other from respective ends 155 and 157 of the first 152 and second 154 segments. Because the terminals 156 and 158 extend away from each other along the same longitudinal axis, the connector 150 is a straight connector i.e. the connector used at junction 24. Although not shown in FIG. 6, an end region of each of the first 152 and second 154 segment is extendable in some embodiments similar to that of connector 50, but this is not required in all embodiments.

Although the straight (e.g. 150) and right angle (e.g. 200) connectors are described, the disclosure is not limited to these fixed connectors and extends to connectors having a fixed angle anywhere from about 5° to about 180°. For example, the connector may be substantially T-shaped for connecting to other connectors at three end portions.

Figure 7:
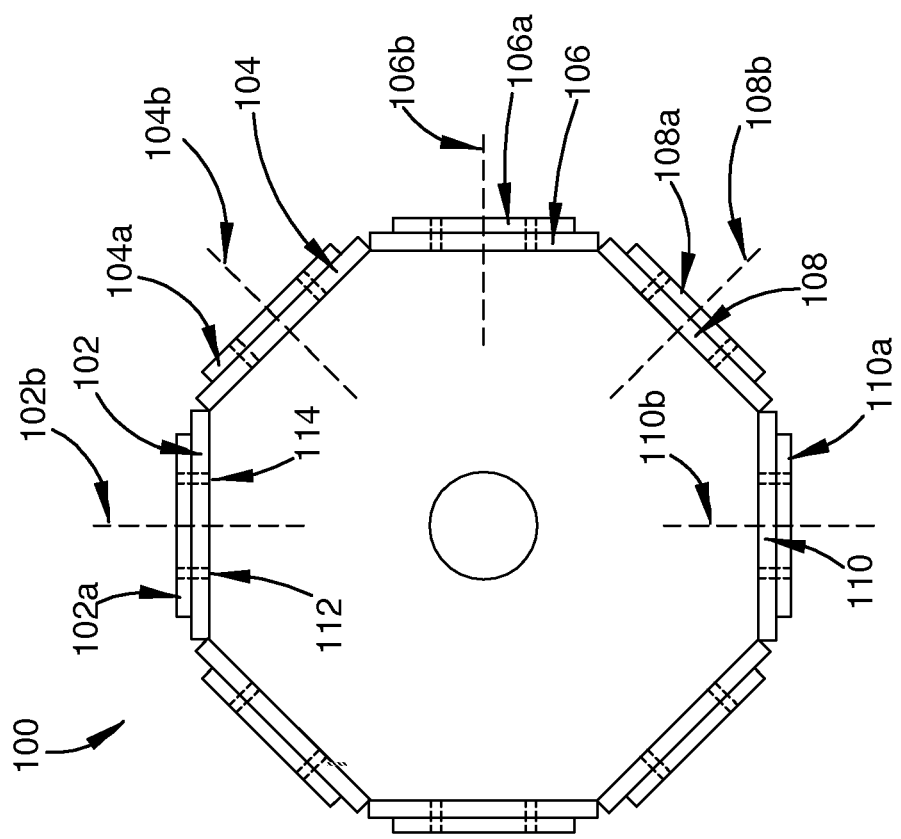
FIG. 7 shows a plan view of another embodiment of a connector.

Another embodiment of a connector is shown in FIG. 7. Connector 100 is formed from a body having an octahedral outline. A first connecting region in the form of first face 102 has an extendable region 102a that is moveable away from or towards face 102 along longitudinal axis 102b that extends substantially perpendicular to a plane of first face 102. Extendable region 102a functions similarly to extendable region 62 and 64 from connector 50. The first face 102 has terminals 112 and 114. The terminals 112 and 114 are similar to the terminals in connector 50.

A second connecting region in the form of second face 104 is positioned next to first face 102 and has an extendable region 104a that is moveable along axis 104b. Similarly, third 106, forth 108 and fifth 110 faces each are positioned adjacent one another and have respective extendable regions 106b, 108b and 110b, and associated axis 106b, 108b and 110b, respectively.

The axis of each face is positioned approximately 45° relative an adjacent face. For example, axis 102b and axis 104b are orientated approximately 45° relative each other. Having an octahedral connector means that a variety of connection angles can be used by a single connector. For example, if an end of a first photovoltaic element is connected to face 102, an end of an adjacent second photovoltaic element can be connected to face 104, 106, 108 or 110 so that the second photovoltaic element will then extend along an axis that is 45°, 90°, 135° or 180°, respectively, relative to the first photovoltaic depending on which face the second photovoltaic element is connect to. For the connector 100 to act as connector 20a in the corner of the panel 16, then adjacent photovoltaic elements will be electrically connected together via the first 102 and third 106 faces. Similarly, for connector 100 to act as the connector at junction 24, adjacent photovoltaic elements will be electrically connected together via the first 102 and fifth 110 face.

Although an octagon is described in FIG. 7, the connector can have any number of connecting regions in the form of faces of a polygon, such as a hexagon or a square.

Regardless of the specific terminal design in connector 50, 100, 150 or 200, the terminals of the connectors will typically be rated for electrical loads of >1A and <50 VDC, although the specific loads will depend on the circuit design of the system 10.

The connector 50 is fitted with a locking means (not shown) for locking at least one of the first 52 and second 54 segments to an end (12 or 14) of the photovoltaic element 11. Connectors 100, 150 and 200 are similar fitted with a locking means in some embodiments. In some embodiments the locking means includes an interference fit, such as a compression fitting where a male section is oversized relative a female segment, and/or a snap fitting where one of the connector 50 or end 12 or 14 has a feature that can engage with a respective feature that prevents removal of the connector 50 from the end 12 or 14. In some embodiments the locking means allows for removal of the connector 50 from the end 12 or 14 by disengaging the locking feature. The locking means also includes a taped bore into which a bolt may be inserted to bolt the connector to an end of the photovoltaic element.

The connectors are generally flat and the connecting regions may have a thickness of a few millimetre or less. Further, the connecting regions of the connectors may have a width in the range of 1-5 mm, 5-10 mm, 10-15 mm, 15-20 mm, 20-25 mm and 25-30 mm, 30-40 mm, 40-50 mm and 50-60 mm or more.

The connector 50, 100, 150 and 200 is generally made from an electrically non-conductive material. Because the connector in use is positioned near a perimeter of a panel such as a window and will be exposed to UV light, in some embodiments the connector 50 is made from UV-rated polymer.

To install the system 10 on, for example, a window, each of the photovoltaic elements 11*a-h* and 13*a-h* are connected to one another using the required number of connectors, e.g. connector 50, and the assembled ring is then attached to the window near its perimeter. However, in some embodiments, linear sections are first formed by combining adjacent photovoltaic elements in a straight line (e.g. elements 11*c* and 11*b*) with a straight connector to form a straight element module. The straight element module is then positioned on the window, then corner connectors are used to connects the straight element module together.

It will be understood to persons skilled in the art of the invention that many modifications may be made without departing from the spirit and scope of the invention.

In the claims which follow and in the preceding description, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments.

The invention claimed is:

1. A system for generating electricity, comprising:
at least two photovoltaic modules each having at least one photovoltaic element, each photovoltaic module having ends, each end having an electrical coupling portion that is electrically coupled to the at least one photovoltaic element, each photovoltaic module being configured to be positioned in use near a perimeter of a panel that is at least partially transmissive for visible light; and
an electrical connector having a first connecting region and a second connecting region pivotably connected to one another about a pivot point and configured to electrically couple to the electrical coupling portions of adjacent photovoltaic modules;
wherein at least one selected from a group consisting of the first and second connecting regions has a respective extendable region that is configured to be moveable relative to the respective connecting region.

2. The system of claim 1 wherein the first and second connection regions define a plane and the connector is arranged such that the first and second connection regions are pivotable within that plane.

3. The system of claim 1 wherein the first and second connection regions define a plane when in flat configuration, and the connector is arranged such that the plane of the first connection region is transverse to the plane of the second connection region when the first and second connection regions are pivoted relative to each other and out of the flat configuration.

4. The system of claim 1, wherein one or both ends of at least one of the at least two photovoltaic modules have electrical coupling portions that comprise a female coupling portion and the connector comprises one or more respective male connection portions for coupling to the female coupling portion of the electrical coupling portion.

5. The system of claim 1, wherein one or both ends of at least one of the at least two photovoltaic modules have electrical coupling portions that comprise a male coupling portion and the connector comprises one or more respective female connection portions for coupling to the male coupling portion of the electrical coupling portion.

6. The system of claim 1, wherein a locking means is configured to lock the connector to one or both of the electrical coupling portions from adjacent photovoltaic modules.

7. The system of claim 1, wherein each of the electrical coupling portions comprise a negative terminal and a positive terminal, wherein the connector is configured to connect respective positive and negative terminals from adjacent photovoltaic modules.

8. The system of claim 1, wherein the extendable region of at least one selected from the group consisting of the first and second connecting region is configured to be slidable relative to the respective connecting region.

9. The system of claim 1, wherein the extendable region of at least one selected from the group consisting of the first and second connecting region is configured slidable relative to the respective connecting region along portions of corresponding faces of each structure.

10. The system of claim 1, wherein the extendable region of at least one selected from the group consisting of the first and second connecting region is configured to be in telescopic relation with the respective connecting region.

11. The system of claim 1, wherein the extendable region of at least one selected from the group consisting of the first and second connecting region is configured to be biased toward an extended position relative to the respective connecting region.

12. The system of claim 1, further comprising the panel and wherein the at least two photovoltaic modules are positioned adjacent to one another near a perimeter of the panel and are connected to one another with the connector.

13. The system of claim 12, wherein the at least two photovoltaic modules are positioned on the panel end-to-end in a straight line approximately parallel to an edge of the panel.

14. The system of claim 12, comprising a plurality of photovoltaic modules and a plurality of connectors positioned near the perimeter of the panel.

15. The system of claim 12, wherein the at least two photovoltaic modules are positioned on the panel so that a longitudinal direction of each module is transverse to one another.

16. The system of claim 15, wherein the ends of adjacent photovoltaic modules that are connected by the connector are positioned near a corner of the panel.

* * * * *